United States Patent [19]

Ross

[11] 4,204,243
[45] May 20, 1980

[54] POLARITY INDICATING AND REVERSING UNIT

[76] Inventor: Anthony J. Ross, 526-74th St., Anna Marie Island, Holmes Beach, Fla. 33510

[21] Appl. No.: 882,607

[22] Filed: Mar. 2, 1978

[51] Int. Cl.² .................... H01R 3/06; G01R 31/02
[52] U.S. Cl. ................................. 361/245; 361/246; 324/440
[58] Field of Search .................. 361/245, 246; 324/51, 324/133; 340/649, 654; 339/147 P, 153, 154, 157, 129, 130, 132; 307/138, 127, 147, 148, 150, 71, 85

[56] References Cited

U.S. PATENT DOCUMENTS

| | | | |
|---|---|---|---|
| 755,669 | 3/1904 | Hutchison | 324/133 |
| 3,626,354 | 12/1971 | Banner | 339/14 R |
| 3,733,576 | 5/1973 | Cooper | 324/51 X |
| 3,809,961 | 5/1974 | Kershaw | 340/649 |
| 3,821,639 | 6/1974 | De Langis | 324/51 |
| 3,851,243 | 11/1974 | Banner | 324/51 |
| 3,898,557 | 8/1975 | Strock | 324/51 |
| 3,904,958 | 9/1975 | Gartland, Jr. et al. | 324/51 |
| 3,924,914 | 12/1975 | Banner | 324/51 X |
| 3,967,195 | 6/1976 | Averitt et al. | 324/51 |
| 3,991,320 | 11/1976 | Ross | 307/147 |
| 4,034,284 | 7/1977 | Peplow et al. | 324/51 |
| 4,118,690 | 10/1978 | Paynton | 324/51 |

Primary Examiner—J. D. Miller
Assistant Examiner—L. C. Schroeder
Attorney, Agent, or Firm—Morsbach & Pillote

[57] ABSTRACT

A polarity indicating and reversing unit for connecting a power supply line to a load line, the unit having a polarity indicating lamp for indicating a reverse polarity condition at the load and and a polarity reversing switch for reversing the polarity of the voltage applied to the load and to the polarity indicator so that the polarity indicator also indicates when the reversed polarity condition has been corrected. The application also discloses a polarity indicating and reversing unit for connecting two two-wire plus ground power supply lines each having a neutral and a hot inlet conductor to a single three-wire plus ground load line having a common neutral and two hot outlet conductors. The latter polarity reversing unit has a polarity indicator lamp for indicating when above ground potential is applied to the neutral outlet conductor, and two polarity reversing switches which are selectively operable to reverse polarity of the connections of either of the two inlet lines to the common outlet line. The unit has two inlet plugs adapted for connection to the two power supply lines and automatic disconnect relays are provided to electrically disconnect either of the inlet plugs from the unit when a power supply line is not connected to that inlet plug.

6 Claims, 7 Drawing Figures

POLARITY INDICATING AND REVERSING UNIT

BACKGROUND

Grounding in electrical wiring systems is done primarily as a safety measure and, in such wiring systems, one of the current carrying conductors is connected to ground, to provide a system ground or neutral, and a separate ground wire or metallic conductor is provided as an equipment ground. It is common practice to use polarized plugs and receptacles to connect portable tools and appliances and mobile units to such a grounded wiring system. The use of polarized plugs and receptacles, if they are properly wired, should assure that the voltage applied to the portable appliance or tool or mobile unit was of the proper polarity. However, errors are sometimes made in connecting the wires at some point up to the power supply receptacle, or in connecting the wires of an extension cord to either the plug or receptacle at opposite ends of the extension cord, and such errors in wiring can cause the application of an incorrect or reverse polarity to the portable tool or appliance or mobile unit, with consequent safety hazards.

Some mobile units such as mobile homes and trailers have three-wire plus ground type internal wiring systems in which one wire is the grounded neutral and two other wires are hot wires. However, some trailer parks and the like only provide two-wire plus ground service and difficulties are encountered in connecting a mobile unit having a three-wire plus ground system to a two-wire plus ground service to provide adequate power to the mobile unit.

It has heretofore been proposed, for example as shown in U.S. Pat. Nos. 3,626,354; 3,733,576; and 3,851,243 to provide an adapter for connecting a grounded power supply to a portable tool or appliance, and which included some means for indicating when the polarity was reversed and an arrangement in which either the plug or the receptacle end of the adapter could be manipulated for connection in either of two different positions to a complementary polarized connector to reverse the polarity between the power supply and the portable tool or appliance. Such adapters, however, required, manual disconnection of either the plug or receptacle end of the adapter from the system accompanied by manual reversal of the position of the adapter and reconnection of the adapter in the system. Moreover, such adapters were not suitable for connecting a three-wire plus ground load system to a two-wire plus ground power supply.

SUMMARY OF THE INVENTION

An important object of the present invention is to provide a polarity indicating and reversing unit for connecting a power supply to a load and which has a polarity indicator for indicating reverse polarity at the load and a polarity reversing switch for reversing the polarity of the voltage applied to the load and to the polarity indicator so that the polarity indicator also indicates when the reverse polarity condition has been corrected.

Another object of the present invention is to provide a polarity indicating and reversing unit for connecting a three-wire plus ground type load to two two-wire plus ground type power supply lines, polarity indicating means for indicating when a reverse polarity is applied from either power supply line to the load, and polarity reversing switches for reversing the polarity of the voltage applied by either or both of the power supply lines to the load.

Yet another object of the present invention is to provide a polarity indicating and reversing unit having two power inlet connectors for connecting two power supply lines to a three-wire plus ground load line, and which prevents application of voltage from one power inlet connector to the other power inlet connector, if a power supply line is not connected to the last mentioned power inlet connector.

These, together with other objects, features and advantages of this invention will be more readily understood by reference to the following description, when taken in connection with the accompanying drawings wherein.

Figure 1:
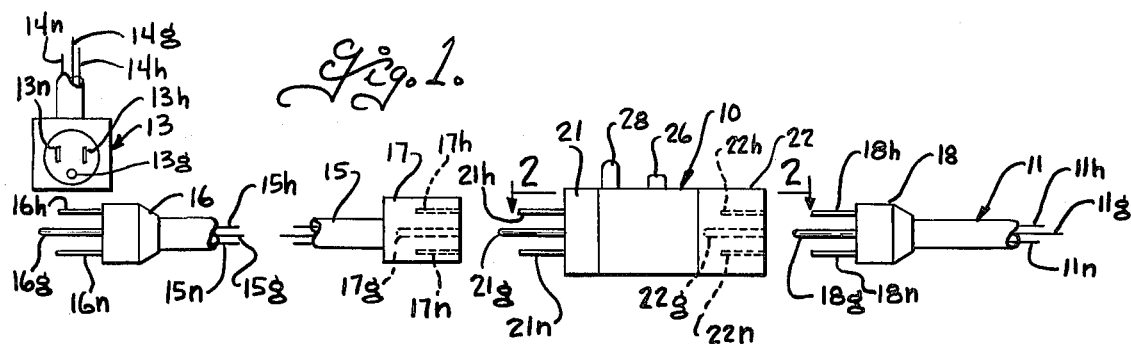
FIG. 1 is an exploded view illustrating connection of one form of polarity indicating and reversing unit between a two-wire plus ground power supply and a two-wire plus ground load.

Reference is now made more specifically to the embodiment of FIGS. 1–4 in which the polarity indicating and reversing unit 10 is arranged for connecting a two-wire plus ground load line 11 to a two-wire plus ground power supply line 14. As diagrammatically shown in FIG. 1, the power supply line 14 includes a receptacle 13 having neutral and hot prong receiving terminals 13n and 13h and a ground prong receiving terminal 13g respectively connected to inlet line wires 14n and 14h and ground conductor 14g leading to the power supply. As is conventional in such a grounded supply system, the neutral power conductor 14n is grounded and wire 14g is also grounded to provide a separate equipment ground.

The polarity indicating and reversing unit 10 can be directly plugged into the power supply receptacle 13 and utilized to indicate and correct any reversed polarity condition that exists in the power supply up to the receptacle 13. However, extension cords such as diagrammatically indicated at 15 in FIG. 1 are commonly utilized to connect the stationary power supply receptacle to the load line and, in such installations, the polarity indicating and reversing unit is advantageously connected between the outlet of the extension cord and the load line to indicate and correct a reversed polarity condition that may occur due to errors in wiring in the extension cord. The inlet power supply receptacle 13 is polarized, that is the prong receiving terminals 13n, 13h and 13g are arranged to receive a plug in only one position, and the extension cord 15 has a plug 16 with prongs 16n, 16h, and 16g correspondingly polarized so as to be receivable in the polarized receptacle 13. Extension cord 15 includes wires 15n and 15h respectively connected to the plug prongs 16n and 16h and a ground conductor such as a wire 15g connected to the ground prongs 16g. Extension cord 15 also has a polarized receptacle at its other end including prong receiving terminals 17n and 17h respectively connected to conductors 15n and 15h and a ground prong receiving terminal 17g connected to conductor 15g. The load line 11, which can be connected to a portable tool or appliance or to the internal wiring system of a mobile unit such as a mobile home or trailer, has a polarized plug 18 with prongs 18n and 18h connected to line wires 11n and 11h, and a ground prong 18g connected to a ground conductor 11g in the load line. The plug 18 on the load line is also polarized so that it can be received in the plug 17 of the extension cord or in the power supply receptacle 13.

Figure 2:
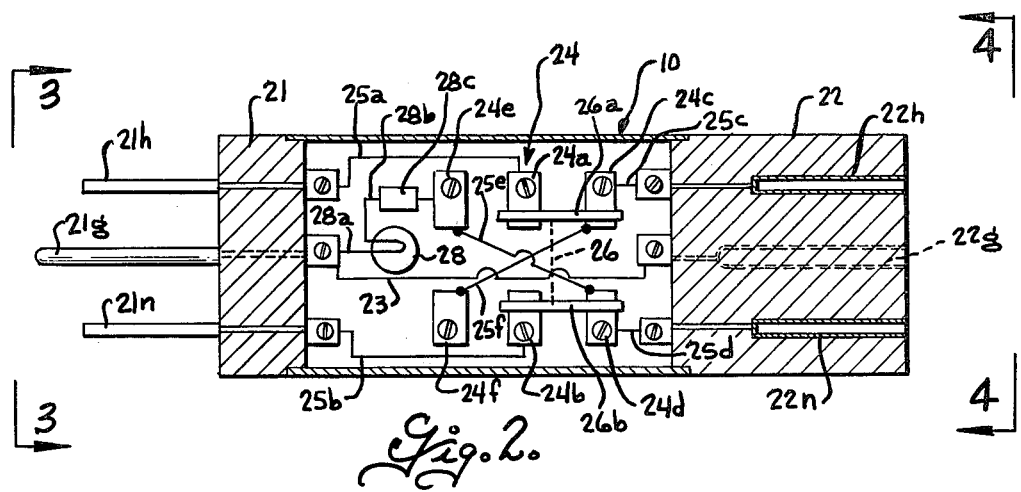
FIG. 2 is a horizontal sectional view through the polarity indicating and reversing unit, taken on the plane 2—2 of FIG. 1.
Figure 3:
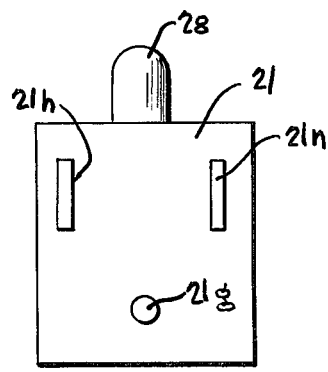
FIG. 3 is an end elevational view of the polarity indicating and reversing unit taken on the plane 3—3 of FIG. 2.
Figure 4:
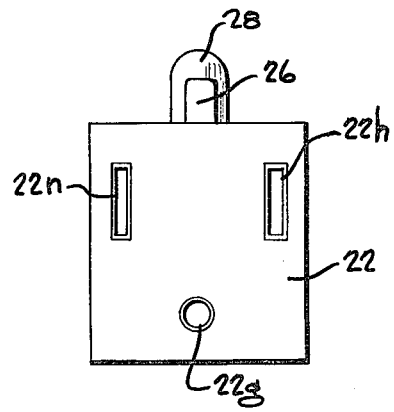
FIG. 4 is an end elevational view of the polarity indicating and reversing unit taken on the plane 4—4 of FIG. 2.

The polarity indicating and reversing unit 10 is advantageously of the plug-in type which can be connected in the circuit between the load line 11 and either the extension cord 15 or the receptacle 13. As best shown in FIG. 2, the polarity and indicating reversing unit includes a plug-type inlet connector 21 having neutral and hot inlet line terminals or prongs 21n and 21h, and an inlet ground prong 21g. The inlet connector 21 is polarized to be received in the receptacle 17 of the extension cord or the power supply receptacle 13, and the terminals or prongs 21n and 21h are the nominally neutral and hot line terminals, that is the line terminals that would be respectively grounded and hot, if all connections in the power supply lines and extension cords were correct. The polarity indicating and reversing unit also has a polarized outlet connector 22 conveniently adjacent its other end, and having neutral and hot outlet line connector terminals adapted for receiving the prongs 18n and 18h of the load line plug 18, and an outlet ground terminal 22g adapted to receive the ground prong 18g of the load line. The inlet ground terminal 21g is directly connected by a ground conductor 23 to the outlet ground terminal 22g to maintain continuity of the appliance ground. A double pole double throw polarity reversing switch 24 is provided for reversibly connecting the input line terminals 21n and 21h to the output terminals 22n and 22h. As diagrammatically illustrated in FIG. 2, the polarity reversing switch has input switch terminals 24a and 24b which are respectively connected as by conductors 25a and 25b to the input connector terminals 21h and 21n. A pair of output terminals 24c and 24d of the polarity reversing switch are respectively connected as by conductors 25c and 25d to the output connector terminals 22h and 22n. Another pair of terminals 24e and 24f of the polarity reversing switch are internally cross connected as by conductors 25e and 25f to the outlet terminals 24c and 24d respectively. The reversing switch also includes first and second movable switch members 26a and 26b which are movable under the control of a manually operable switch actuator 26. The switch members 26a and 26b are movable from a first position shown in solid lines in FIG. 2, respectively connecting switch terminals 24a and 24c, and switch terminals 24b and 24d to a second position in which they connect the switch terminals 24a and 24e, and switch terminals 24b and 24f. A polarity indicator, advantageously in the form of a lamp 28, is electrically connected as by conductors 28a and 28b to sense the voltage between the neutral outlet terminal 22n and ground, to indicate when the voltage applied to the neutral outlet terminal is in its above ground potential. Lamp 28 can be a low voltage lamp and an impedance such as a high resistance 28c is connected in series with the lamp to limit the current to a very low value.

In use, the load line plug 18 is plugged into the outlet connector or receptacle 22 of the polarity indicating and reversing unit 10 and the inlet connector 21 of the unit is either plugged directly into the supply receptacle 13 or into the plug 17 on an extension cord, if one is used. When the polarity reversing switch members 26a and 26b are in their first position shown in solid lines in FIG. 2, in which they connect the input neutral terminal 21n to the output neutral terminal 22n and the input hot line terminal 21h to the output hot line terminal 22h, the output terminal 22n will be at substantially ground potential if all of the wiring ahead of the polarity indicating and reversing unit is correct. Under those conditions, the output terminal 22n will be at ground potential and the lamp 28 will not be illuminated. However, if there is an error in wiring which results in the reversal of the polarity conditions at the nominally neutral and hot input line terminals 21n and 21h, and which would cause the input terminal 21n to be hot while the input terminal 21h is at ground potential, then the polarity reversing switch is moved to its second position to reverse the connections between its input and output terminals and connect the input terminal 21n to the output terminal 22h and the input terminal 21h to the output terminal 22n. This returns the output terminal 22n to ground potential and the lamp 28 will go out indicating that the reversed polarity condition has been corrected.

The polarity indicating and reversing unit can be made in different sizes for different uses. For example, one type of polarity indicating and reversing unit can be used for small appliances and tools with the polarity reversing switch having a rating sufficient to handle the maximum load imposed by such an appliance or tool. A somewhat larger capacity unit would be required for use in connecting mobile units such as motor homes, trailers and boats having a two-wire plus ground type internal wiring to a two-wire plus ground power supply, and the polarity reversing switch would necessarily have to have a correspondingly higher rating to handle the higher loads.

Some motor homes have internal wiring to supply a large number of different loads including refrigeration, air conditioning, lighting, appliances, etc., and utilize a three-wire plus ground type wiring system in which one wire is a common grounded neutral and two of the other wires are hot lines. However, a three-wire plus ground type power supply is not always available at all trailer parks and the motor home is sometimes forced to connect to a two-wire plus ground type power supply. Such two-wire plus ground power supply available at many trailer parks are commonly fused at no more than 20 amps and a single power supply line cannot supply all of the power required for normal operation of the motor home.

A modified form of polarity indicating and reversing units for connecting a three-wire plus ground type load to two two-wire plus ground type power supplies. The polarity indicating and reversing unit is arranged to indicate a reverse polarity condition between either of the two two-wire plus ground type power supplies and the three-wire plus ground load, and to enable reversal of the polarity from either of the power supply lines. In addition, the polarity indicating and reversing unit electrically disconnects each input terminal from the other and from the load system when power is not supplied to the input terminal, to avoid a shock hazzard.

Figure 5:
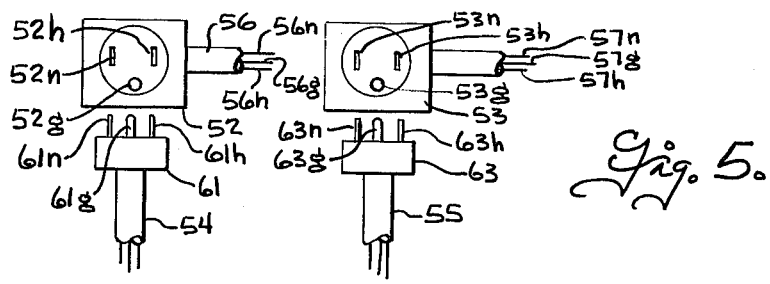
FIG. 5 is an exploded view showing connection of a second embodiment of the polarity indicating and reversing unit between a three-wire plus ground load and two two-wire plus ground power supply lines.

As diagrammatically shown in FIG. 5, the polarity indicating and reversing unit 50 is connected between a three-wire plus ground type load line 51 and two two-wire plus ground type supply receptacles 52 and 53. Extension cords are commonly used to connect the power supply receptacles to the load line and, as shown, two extension cords 54 and 55 are used between the power supply receptacles 52 and 53 and the polarity indicating and reversing unit 50. The power supply receptacles 52 and 53 are polarized and, as shown, receptacle 52 has nominally neutral and hot terminals 52n and 52h connected to supply conductors 56n and 56h and ground terminal 52g connected to a ground conductor 56g. Supply receptacle 53 similarly has nominally neutral and hot line connector terminals 53n and 53h connected to power supply lines 57h and 57n, and the ground terminal 53g connected to a ground line 57g. Extension cord 54 has a plug 61 at one end with hot and neutral line prongs 61h and 61n and ground prongs 61g, and a receptacle 62 at its other end with hot and neutral line connector terminals 62h and 62n and ground terminal 62g. Extension cord 55 similarly has a plug 63 at one end with hot and neutral line prongs 63h and 63n and ground prongs 63g, and the receptacle 64 at its other end with hot and neutral connector terminals 64h and 64n and ground terminal 64g. The three-wire plus ground load line 51 has a plug 66 at one end with a grounded neutral prong 66n, two hot line prongs $66h_1$ and $66h_2$, and a ground prong 66g.

Figure 6:
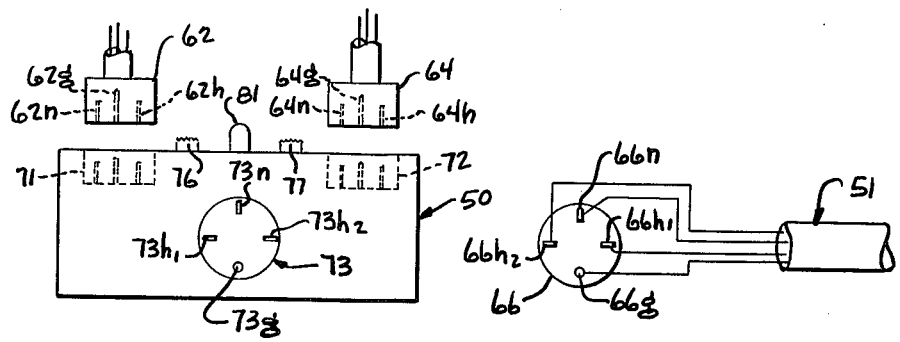
FIG. 6 is a schematic view illustrating a polarity indicating and reversing unit of FIG. 5.

The polarity indicating and reversing unit 50 has two polarized plug-type inlet connectors 71 and 72 adapted to connect with the receptacles 62 and 64 on the extension lines 54 and 55. As best shown in FIG. 6, inlet connector 71 has nominally neutral and hot inlet line terminals or prongs 71n and 71h and an inlet ground terminal 71g. Inlet connector 72 similarly has neutral and hot inlet line terminals 72n and 72h and an inlet ground terminal 72g. The polarity indicating and reversing unit has a single outlet connector or receptacle 73 adapted to receive the plug 66 in the three-wire plus ground load line 51. Outlet receptacle 73 thus has a common neutral outlet line terminal or prong receiver 73n; two hot line outlet terminals or prong receivers $73h_1$ and $73h_2$ and a ground outlet terminal or prong receiver 73g. As will be understood, the outlet terminals 73n, $73h_1$, $73h_2$ and ground terminal 73g of the receptacle 73 are polarized to mate with the corresponding prongs 66n, $66h_1$, $66h_2$, and 66g of the plug 66 for the three-wire plus ground load line 51. The inlet ground connector terminals 71g and 72g are connected to the outlet ground connector terminals 73g by ground conductors 74 and 75. First and second double pole, double throw polarity reversing switches 76 and 77 are provided for reversibly connecting the first and second inlet connectors 71 and 72 to the outlet connector 73. In addition, the first and second normally open relay operated switches 78 and 79 are provided for normally disconnecting the first and second inlet connectors from each other and from the outlet connector 73 to minimize shock hazards when only one inlet connector is in use. A polarity indicator 81 is provided for indicating when the common neutral outlet terminal 73n is above ground potential.

Polarity reversing switch 76 has a pair of input terminals 76a and 76b respectively connected through conductors 85 and 86 to the nominally hot and neutral inlet line connector terminals 71h and 71n. Switch 76 has a pair of output terminals 76c and 76d respectively connected through conductors 87 and 88 to the input terminals 78c and 78d of normally open double pole relay switch 78. Output terminals 78e and 78f of the normally open double pole relay switch 78 are connected through conductors 89 and 90 to the common neutral and first hot line connector terminal 73n and $73h_1$ respectively of the outlet receptacle 73. Similarly reversing switch 77 has a pair of inlet terminals 77a and 77b connected through conductors 101 and 102 to the nominally hot and neutral inlet line terminals 72h and 72n of connector 72, and polarity reversing switch 77 has outlet terminals 77c and 77d connected by conductors 103 and 104 to the input terminals 79c and 79d of normally open double pole relay switch 79. Outlet terminals 79e and 79f of relay switch 79 are connected through conductors 105 and 106 to the hot and neutral outlet line connectors $73h_2$ and 73n of the outlet receptacle 73. Double pole relay switch 79 has normally open switch contactors 79a and 79b that are operated to their closed position by an electroresponsive operator or coil 79h connected across the input terminals 79c and 79d. Similarly, double pole relay switch 78 has normally open switch contactors 78a and 78b that are operated to their closed position by an electro-responsive operator or coil 78h connected across the input terminals 78c and 78d. Polarity indicator 81 is conveniently in the form of a lamp having one terminal grounded as indicated at 81a and the other terminal connected through a high impedance such as a resistor 81b and line 81c to the neutral outlet line terminal 73n so as to indicate when the outlet line terminal is at above ground potential.

Polarity reversing switch 76 has switch elements 76g and 76h movable from a first position connecting terminals 76a and 76c and terminals 76b and 76d, to a second position connecting terminals 76a and 76c and terminals 76b and 76f. Terminals 76e and 76f are internally cross-connected to terminals 76c and 76d by conductors 76j and 76k so that the connections between the inlet terminals 76a and 76b and the outlet terminals 76c and 76d can be selectively reversed. Similarly, polarity reversing switch 77 has switch elements 77g and 77h movable from a first postion connecting terminals 77a and 77c. and terminals 77b and 77d, to a second position connecting terminals 77a and 77e and terminals 77b and 77f. Terminals 77e and 77f are internally cross-connected by conductors 77j and 77k to the outlet terminals 77c and 77d so that the connections between the switch inlet terminals 77a and 77b and outlet terminals 77c and 77d can be selectively reversed.

When one two-wire power supply line is connected as by extension cord 54 to one of the inlet connectors 71, power is supplied to the normally neutral and hot line terminals 71n and 71h. Electroresponsive operator 78h of relay 78 will be energized by the voltage across terminals 71n and 71h to close normally open relay switch contactors 78a and 78b and thereby apply power to the neutral and one hot line outlet terminal 73n, $73h_1$ respectively of the outlet receptacle 73. If the reversing switch 76 is in its first position shown in FIG. 6, and if the polarity at the inlet connector terminals 71n and 71h is correct, then the polarity at the outlet terminals 73n and $73h_1$ will also be correct and the polarity indicator lamp 81 will not be illuminated. However, if it is incorrect, due for example to an error in wiring in the extension cord or in the outlet receptacle or otherwise, so that the polarity at the outlet terminal 73n will be reversed, lamp 81 will be illuminated. Polarity reversing switch 76 can then be moved to its second position to reverse the connection between the input terminals 71n, 71h of the inlet connector 71 and the output terminals 73n, 73h of the outlet connector 73 so that the outlet neutral terminal 73n will again be returned to ground potential. The indicator lamp 81 will then go out to indicate that the reverse polarity condition has been corrected. When power is applied to only one of the inlet connectors such as 71, power is not applied to the second outlet terminal 73h. In addition, the other relay 79 remains open so that no power is applied to the inlet terminals 72n and 72h in the other inlet connector 72, to thereby avoid creating a shock hazard at the terminals of other inlet connector. When a second power supply is connected to the inlet connector 72, the relay coil 79h is energized to close contacts 79a and 79b and apply power to the neutral 73n and hot outlet terminal $73h_2$ of the outlet receptacle 73. If the polarity at the second inlet terminal 72 was correct, the lamp 81 will remain deenergized. However, if it is reversed, it will be energized until the second polarity reversing switch 77 is moved to its second position to reverse the polarity condition.

Figure 7:
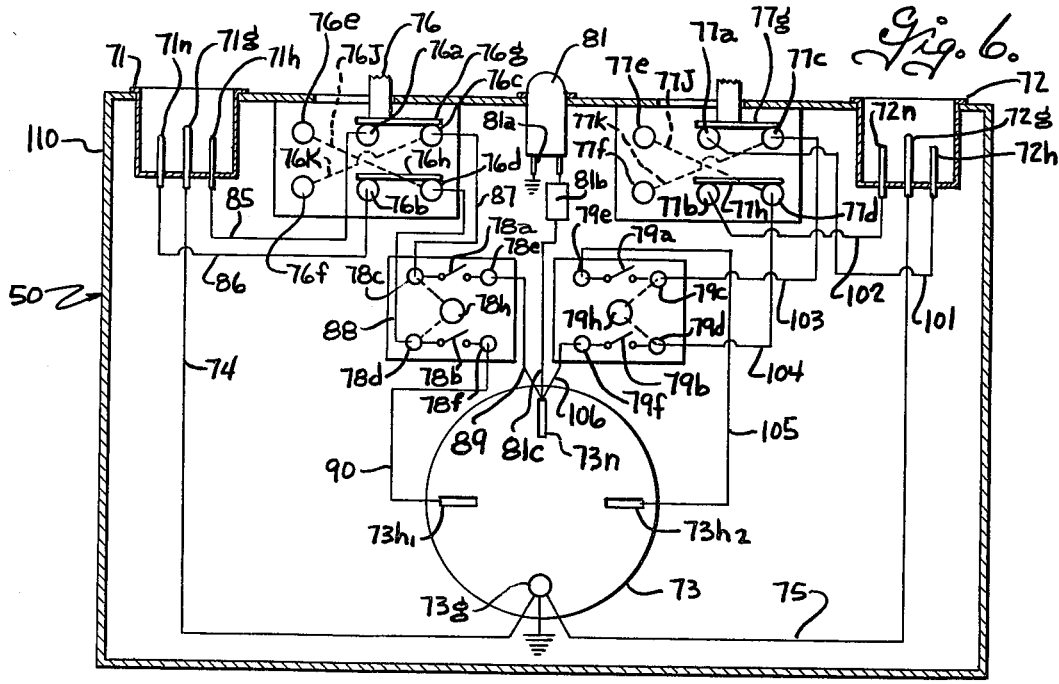
FIG. 7 is a top plan view of the polarity indicating and reversing unit of FIG. 5.
Figure 7:
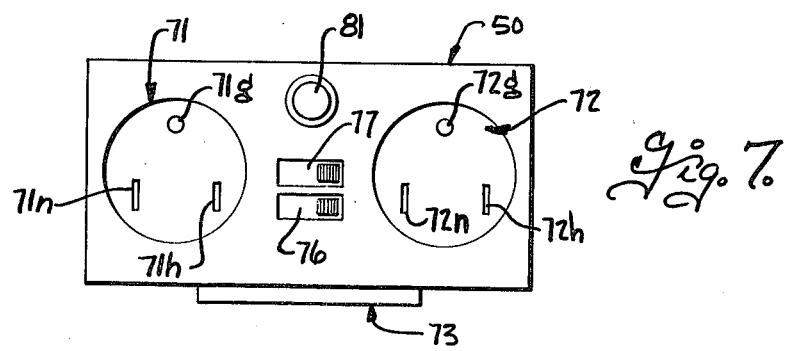

With the polarity indicating and reversing unit 50 shown in FIGS. 5–7, one or two two-wire plus ground-type power supply lines can be connected to a single three-wire plus ground load system. A reversed polarity condition between either or both of the power supply lines and the outlet will be indicated by the lamp 81 and can be corrected by operating one or both of the polarity reversing switches 76 and 77. Moreover, when power is applied to only one of the inlet connectors, the normally open relay switches associated with the other inlet connector disconnects the latter from the system to prevent shocks. As will be seen, relay coils 78h and 79h are connected to the hot and neutral terminals of the respective inlet connectors 71 and 72 and do not cause any current flow in the appliance ground line. Although one terminal 81a of indicator 81 is connected to ground, the indicator with the current limiting impedance 81b causes only a negligible current in the ground conductor.

The reversing switches and relay operated switches are of conventional construction and must, of course, be of the type rated to handle the voltages and currents involved in the load distribution system. The several components of polarity indicating and reversing unit 50 are conveniently mounted on a housing 110 with the terminals of the inlet connectors 71, 72 and outlet connector 73 accessible from externally of the housing and with polarity reversing switches 76 and 77 mounted so as to be manually operable from externally of the housing and with polarity indicator 81 visible from the outside of the housing. The remaining components and interconnecting wiring are enclosed in housing 110.

The embodiments of the invention in which an exclusive property or privilege is claimed are defined as follows:

1. A polarity indicating and reversing unit comprising, first and second inlet connectors each adapted for connection to respective first and second power supply lines of the type having two-line wires plus ground, each inlet connector having an inlet ground terminal and nominally neutral and hot inlet line terminals, an outlet connector adapted for connection to load supply line of the type having three-line wires plus ground, said outlet connector having an outlet ground terminal and first and second hot outlet line terminals and a common neutral outlet line terminal, ground conductor means electrically interconnecting the inlet ground terminals of the first and second inlet connectors and the outlet ground terminal of the outlet connector; first and second double-pole polarity reversing switch means, a first circuit means electrically connecting the first double-pole polarity reversing switch means to the nominally neutral and hot inlet line terminals of the first inlet connector and to the common neutral and first outlet line terminals of the outlet connector, a second circuit means electrically connecting the second double-pole polarity reversing switch means to the nominally neutral and hot inlet line terminals of the second inlet connector and to the common neutral and second hot outlet line terminals of the outlet connector, and polarity indicator means for indicating when the voltage applied to the common neutral outlet line terminal is above ground potential.

2. A polarity indicating and reversing unit according to claim 1 including a double-pole relay switch means, said first circuit means including means electrically connecting said double-pole relay switch means in series with said first double-pole polarity reversing switch means, said double-pole relay switch means being normally open to normally disconnect the neutral and hot inlet line terminals of the first inlet connector from the common neutral and the first hot outlet line terminals of the outlet connector, and electroresponsive relay switch operating means electrically connected to said nominally neutral and hot inlet line terminals of said first inlet connector and responsive to the voltage thereat for closing the double-pole relay switch means.

3. A polarity indicating and reversing unit according to claim 1 including first and second double-pole relay switch means, said first circuit means including means electrically connecting said first double-pole relay switch means in series with said first double-pole polarity reversing switch means, said second circuit means including means electrically connecting said second double-pole relay switch means in series with said second double-pole polarity reversing switch means, said first and second double-pole relay switch means being normally open, and a first electroresponsive relay switch operating means electrically connected to the nominally neutral and hot inlet line terminals of the first inlet connector and responsive to the voltage thereat for closing the first double-pole relay switch means, and a second electroresponsive relay switch operating means electrically connected to the nominally neutral and hot inlet line terminals of the second inlet connector and responsive to the voltage thereat for closing the second double-pole relay switch means.

4. A polarity indicating and reversing unit according to claim 3 wherein said indicator means includes lamp means electrically connected to said common neutral outlet terminal and to said ground conductor means.

5. A polarity indicating and reversing unit according to claim 3 wherein said first and second inlet connectors are polarized plugs and said outlet connector is a polarized receptacle.

6. A polarity indicating and reversing unit comprising, first and second inlet connectors each adapted for connection to respective first and second power supply lines of the type having two-line wires plus ground, each inlet connector having an inlet ground terminal and nominal neutral and hot inlet line terminals, an outlet connector adapted for connection to a load supply line of the type having three-line wires plus ground, said outlet connector having an outlet ground terminal and first and second hot outlet line terminals and a common neutral outlet line terminal, ground conductor means electrically interconnecting the inlet ground terminals on the first and second inlet connectors to each other and to the outlet ground terminal on the outlet connector, a first double-pole polarity reversing switch means and a first double-pole relay switch means, means electrically connecting said first double-pole polarity reversing switch means and said first double-pole relay switch means in series with each other and to the nominal neutral and hot inlet line terminals of the first inlet connector and to the common neutral and first hot outlet line terminals of the outlet connector, said first double-pole relay switch means being normally open to normally electrically disconnect the neutral and hot inlet line terminals of the first inlet connector from the common neutral and first hot outlet line terminals of the outlet connector, first electroresponsive relay switch operating means electrically connected to said nominal neutral and hot inlet line terminals of the first inlet connector and responsive to the voltage thereat for closing the first double-pole relay switch means, said first double-pole polarity reversing switch means being operable from a first position electrically connecting the nominal neutral and hot inlet line terminals of the first inlet connector to the common neutral and first hot outlet line terminals respectively of the outlet connector to a second position electrically connecting the hot and neutral inlet line terminals of the first inlet connector to the common neutral and first hot outlet line terminals respectively of the outlet connector, a second double-pole polarity reversing switch means and a second double-pole relay switch means, means electrically connecting the second double-pole polarity reversing switch means and the second double-pole relay switch means in series with each other and to the nominal neutral and hot inlet line terminals of the second inlet connector and to the common neutral and second hot outlet line terminals of the outlet connector, said second double-pole relay switch means being normally open to electrically disconnect the nominal neutral and hot inlet line terminals of the second inlet connector from the common neutral and second hot outlet line terminals of the outlet connector, second electroresponsive relay switch operating means electrically connected to said nominal neutral and hot inlet line terminals of said second inlet connector and responsive to the voltage thereat for closing the second double-pole relay switch means, said second polarity reversing switch means being operable from a first position electrically connecting the nominal neutral and hot inlet line terminals of the second inlet connector to the common neutral and second hot outlet line terminals respectively of the outlet connector to a second position electrically connecting the hot and neutral inlet line terminals of the second inlet connector to the common neutral and second hot outlet line terminals respectively of the outlet connector, and polarity indicator means for indicating when the voltage applied to the common neutral outlet line terminal of the outlet connector is above ground potential.

* * * * *